US012562741B2

(12) United States Patent
Chan et al.

(10) Patent No.: US 12,562,741 B2
(45) Date of Patent: Feb. 24, 2026

(54) LOW DISTORTION LEVEL SHIFTER

(71) Applicant: Silicon Laboratories Inc., Austin, TX (US)

(72) Inventors: Hua Beng Chan, Singapore (SG); Tak Ying Wong, Singapore (SG); Yun Da Bryan Seah, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 16 days.

(21) Appl. No.: 18/663,698

(22) Filed: May 14, 2024

(65) Prior Publication Data

US 2025/0357928 A1 Nov. 20, 2025

(51) Int. Cl.
H03K 19/0185 (2006.01)
H03K 3/356 (2006.01)

(52) U.S. Cl.
CPC . H03K 19/018528 (2013.01); H03K 3/35613 (2013.01)

(58) Field of Classification Search
CPC ....... H03K 19/018528; H03K 3/35613; H03K 19/018521; H03K 19/018507; H03K 19/0185; H03K 13/356104; H03K 3/356; H03K 3/353; H03K 3/356139; H03K 5/003; H03K 19/0175; H03K 19/017509; G06F 3/00
See application file for complete search history.

(56) References Cited

U.S. PATENT DOCUMENTS

| | | | |
|---|---|---|---|
| 9,923,710 B2 | 3/2018 | Chan et al. | |
| 9,998,277 B2 | 6/2018 | Chan et al. | |
| 10,404,446 B2 | 9/2019 | Chan et al. | |
| 10,461,920 B2 | 10/2019 | Chan et al. | |
| 10,826,677 B2 | 11/2020 | Chan et al. | |
| 11,029,716 B1 | 6/2021 | Chan et al. | |
| 11,402,860 B2 | 8/2022 | Chan et al. | |
| 11,543,843 B2 | 1/2023 | Chan et al. | |
| 2006/0066349 A1* | 3/2006 | Murakami | H03K 3/356113 |
| | | | 326/81 |
| 2009/0115456 A1* | 5/2009 | Chiang | H03K 3/012 |
| | | | 327/333 |

FOREIGN PATENT DOCUMENTS

CN 113346742 B 1/2024

* cited by examiner

*Primary Examiner* — Jung Kim
(74) *Attorney, Agent, or Firm* — Trop, Pruner & Hu, P.C.

(57) ABSTRACT

In one embodiment, a method includes: receiving, in a level shifter, an input signal from a first voltage domain that operates according to a first supply voltage; level shifting the input signal to at least one level-shifted signal having a second voltage greater than the first supply voltage; based on the at least one level-shifted signal, generating a first pulse signal and a second pulse signal; latching the first pulse signal through a latch circuit to form an output signal; and outputting the output signal to a second voltage domain, the second voltage domain to operate according to a second supply voltage greater than the first supply voltage.

13 Claims, 6 Drawing Sheets

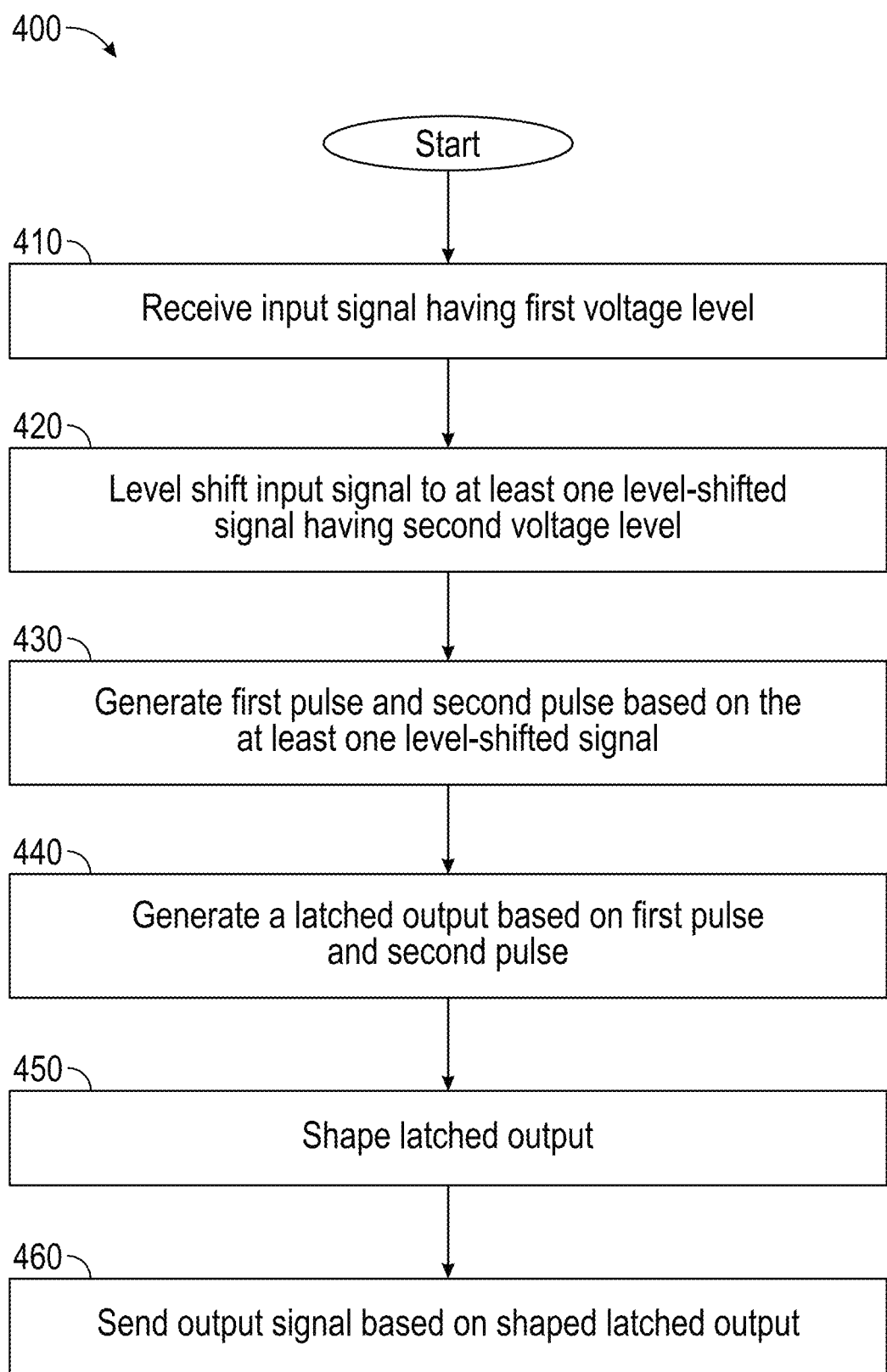

400

Start

410 — Receive input signal having first voltage level

420 — Level shift input signal to at least one level-shifted signal having second voltage level 430 — Generate first pulse and second pulse based on the at least one level-shifted signal 440 — Generate a latched output based on first pulse and second pulse 450 — Shape latched output 460 — Send output signal based on shaped latched output

FIG.4

LOW DISTORTION LEVEL SHIFTER

BACKGROUND

Many integrated circuits include circuitry that operates at different voltage levels. For example, internal digital circuitry may operate at a lower voltage than input/output circuitry that is to couple to another device. To accommodate these differences, level shifting circuitry may be included in the integrated circuit. However, a conventional level shifter can cause distorted signaling (e.g., clock or data signaling). This distortion may result due to mismatch in delay, rise and fall times, and/or supply voltage (and/or ground) noise. Current level shifters thus incur performance degradation.

SUMMARY OF THE INVENTION

In one aspect, an apparatus includes: a level shifter to receive an input signal having a first voltage range and output at least one level-shifted signal based on the input signal; a pulse generation circuit coupled to the level shifter, the pulse generation circuit to generate a first pulse and a second pulse based at least in part on the at least one level-shifted signal; a latch circuit coupled to the pulse generation circuit, the latch circuit to receive the first pulse and the second pulse, and, based at least in part thereon, output a latched output signal; and a shaper circuit to receive the latched output signal and output an output signal based on the latched output signal, the output signal having a second voltage range greater than the first voltage range.

In one implementation, the pulse generation circuit comprises delay circuitry to delay the at least one level-shifted signal. The delay circuitry may include: a first inverter chain circuit to receive a first level-shifted signal of the at least one level-shifted signal and output a first delayed signal; and a second inverter chain circuit to receive a second level-shifted signal of the at least one level-shifted signal and output a second delayed signal. The delay circuitry may further include: a first logic circuit coupled to the first inverter chain circuit, the first logic circuit to receive the first level-shifted signal and the first delayed signal and based thereon, output the first pulse; and a second logic circuit coupled to the second inverter chain circuit, the second logic circuit to receive the second level-shifted signal and the second delayed signal and output based thereon the second pulse. The first pulse and the second pulse may have a pulse width greater than a gate delay of the latch circuit.

In one implementation, the level shifter includes: a first cross-coupled device pair to receive the input signal and an inverted input signal; and a second cross-coupled device pair coupled to the first cross-coupled device pair, where the second cross-coupled device pair is to provide the first level-shifted signal and the second level-shifted signal to the pulse generator circuit. The second cross-coupled device pair comprises a pull-down circuit to define a first edge and a second edge of the output signal.

In one implementation, the latch circuit comprises a set reset (SR) latch to receive the first pulse and the second pulse and output the latched output signal. The shaper circuit may include a plurality of inverters to receive the latched output signal and output the output signal based thereon. The apparatus also may include: a digital domain comprising at least one circuit to generate the input signal, the digital domain to operate at the first voltage range; and an input/output circuit coupled to the shaper circuit to communicate the output signal via a bus, the input/output circuit to operate at the second voltage range. In one example, the apparatus comprises a low distortion level shifter.

In another aspect, a method includes: receiving, in a level shifter, an input signal from a first voltage domain that operates according to a first supply voltage; level shifting the input signal to at least one level-shifted signal having a second voltage greater than the first supply voltage; based on the at least one level-shifted signal, generating a first pulse signal and a second pulse signal; latching the first pulse signal through a latch circuit to form an output signal; and outputting the output signal to a second voltage domain, the second voltage domain to operate according to a second supply voltage greater than the first supply voltage.

In one implementation, level shifting the input signal to the at least one level-shifted signal comprises level shifting the input signal to a first level-shifted signal and a second level-shifted signal. The method may further include generating the first pulse signal using the first level-shifted signal and generating the second pulse signal using the second level-shifted signal. The method may further include generating the first pulse signal having a first pulse width less than the input signal and generating the second pulse signal having a second pulse width less than the input signal. The method also may include receiving the input signal from the first voltage domain comprising a digital domain, and outputting the output signal to the second voltage domain comprising an input/output domain coupled to at least one bus.

In yet another aspect, a wireless device includes a first integrated circuit (IC) comprising at least one transceiver and a memory coupled to the first IC via a bus. In an embodiment, the IC includes a digital domain to operate with a first supply voltage, an input/output (I/O) domain to operate with a second supply voltage greater than the first supply voltage, and a level shifter coupled between the digital domain and the I/O domain.

In an embodiment, the level shifter includes: a first circuit to receive an input signal from the digital domain and output at least one level-shifted signal based on the input signal; a pulse generation circuit coupled to the first circuit, the pulse generation circuit to generate a first pulse and a second pulse based at least in part on the at least one level-shifted signal; and a latch circuit coupled to the pulse generation circuit, the latch circuit to receive the first pulse and the second pulse, and, based at least in part thereon, output an output signal.

In one implementation, the level shifter further comprises a shaper circuit to receive from the latch circuit the output signal, shape the output signal and provide the shaped output signal to the I/O domain. The pulse generation circuit may include: inverter circuitry to receive a first level-shifted signal and a second level-shifted signal of the at least one level-shifted signal and output a first delayed signal and a second delayed signal; logic circuitry coupled to the inverter circuitry, the logic circuitry to receive the first level-shifted signal, the second level-shifted signal, the first delayed signal, and the second delayed signal, and based thereon, output the first pulse and the second pulse.

In one embodiment, the first circuit comprises: a first cross-coupled pull-up device pair to receive the input signal and an inverted input signal; and a second cross-coupled pull-down device pair coupled to the first cross-coupled device pair, where the second cross-coupled pull-down device pair is to provide the first level-shifted signal and the second level-shifted signal to the pulse generator circuit.

BRIEF DESCRIPTION OF THE DRAWINGS

FIG. 4 is a flow diagram of a method in accordance with an embodiment.

DETAILED DESCRIPTION

In various embodiments, a level shifter is provided to enable high speed level shifting to occur with low distortion. Embodiments realize this low distortion level shifting operation by providing pulse generation circuitry that receives edge signaling of an input signal via pull-down devices of a level shifter, instead of also relying on pull-up devices. Still further, this pulse generation circuitry may generate from the edge signaling of the input signal multiple pulses of a shorter duration than present within the input signal. These pulses in turn are provided to latch circuitry, which operates to generate a low distortion output signal based on these pulses, by setting rising and falling transitions of the level-shifted signal. Embodiments may be used to generate a level-shifted signal that has a sharp, low distortion duty cycle.

Figure 1:
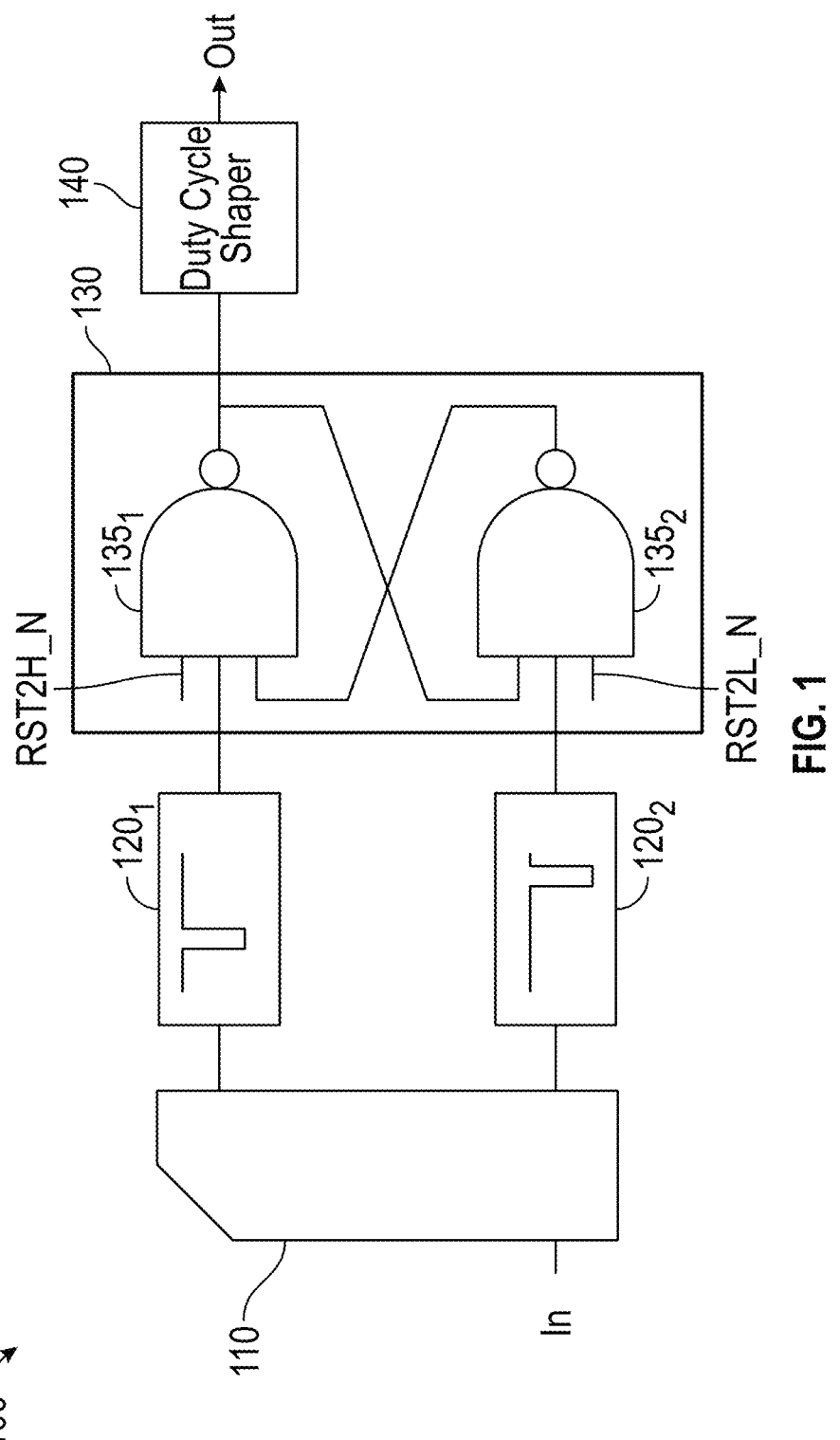
FIG. 1 is a block diagram of a level shifter in accordance with an embodiment.

Referring now to FIG. 1, shown is a block diagram of a level shifter in accordance with an embodiment. As shown in FIG. 1, level shifter 100 is implemented as a low distortion level shifter to receive an input signal and shift that input signal to a higher voltage with low distortion. Although embodiments are not limited in this regard, as one example the input signal may be received with a maximum voltage of 0.8 volts (V) and be output with a maximum voltage of, e.g., 1.2-1.8V but understand that the maximum voltage can be higher in other embodiments.

In the high level view shown in FIG. 1, level shifter 100 includes a first stage level shifter 110 that is configured to receive an input signal (In) that has a maximum voltage based on a first supply voltage level. In an embodiment, this first supply voltage level may be at 0.8V, such that the input signal has a maximum level of 0.8V. The first supply voltage may be provided by a first voltage regulator (e.g., a first on-chip voltage regulator (not shown in FIG. 1) that is on a single semiconductor die with the circuitry of level shifter 100).

Level shifter 110 is configured to shift the input signal level to a second, higher voltage (a desired higher level voltage). Thus the input signal is shifted to have a maximum voltage that is based on a second supply voltage level. In an embodiment, this second supply voltage level may be between approximately 1.2-1.8V, as provided by a second voltage regulator (e.g., another on-chip voltage regulator). Thus level shifter 110 transforms the input signal to have a maximum voltage level of between 1.2-1.8V.

As shown, level shifter 110 outputs multiple versions of the level-shifted signal to corresponding pulse generators 120$_{1,2}$, namely the level-shifted signal and an inverted level-shifted signal. Note that in some cases, level shifter 110 may output a single level-shifted signal. In the embodiment of FIG. 1, pulse generators 120 receive phase-shifted versions of the level-shifted signal and generate therefrom shorter pulses. Although embodiments are not limited in this regard, in an example pulse generators 120 operate to reduce a pulse width of an input signal from a first duty cycle (e.g., a 50% duty cycle, such as for a clock signal) to a second duty cycle that is smaller than the first duty cycle (e.g., between approximately 5 to 10%). Various techniques for generating these pulses are possible, and are described in more detail below.

Still referring to FIG. 1, the resulting pulses are provided to a set reset latch (SR) latch 130. In the high level view shown in FIG. 1, SR latch 130 is implemented with cross-coupled NAND gates 135$_{1,2}$. The resulting output of SR latch 130 is provided to a duty cycle shaper 140, which operates to shape a duty cycle of the level-shifted signal, resulting in a final level-shifted output signal (Out).

Note that a level shifter in accordance with an embodiment may be used at various locations within an integrated circuit (IC). For example, the level shifter may be present in an interface between a digital domain and an input/output (I/O) domain of an IC. In such cases, the level shifter may be used for both clock and data transmissions along a bus (which may be internal to the IC or for coupling to an external bus). In various implementations, the level shifter may be used for changing a voltage level of data and/or clock signals for single data rate (SDR) or double data rate (DDR) transmissions. In one or more embodiments, data transmissions can occur at high speeds, e.g., up to approximately 350 megahertz (MHZ). The level shifter can be used in different situations such as any interface that require low-to-high voltage conversion with low distortion. For example, embodiments may be used in oscillators and/or internal/external memories. Such level shifter may be used in other instances as well. As another example, a level shifter in accordance with an embodiment may be implemented in interface circuitry between intermediate frequency (IF) circuitry and radio frequency (RF) circuitry of a transmitter and/or receiver. A still further use case may be in connection with an interface circuit between a feedback divider and a charge pump of an RF synthesizer.

Figure 2:
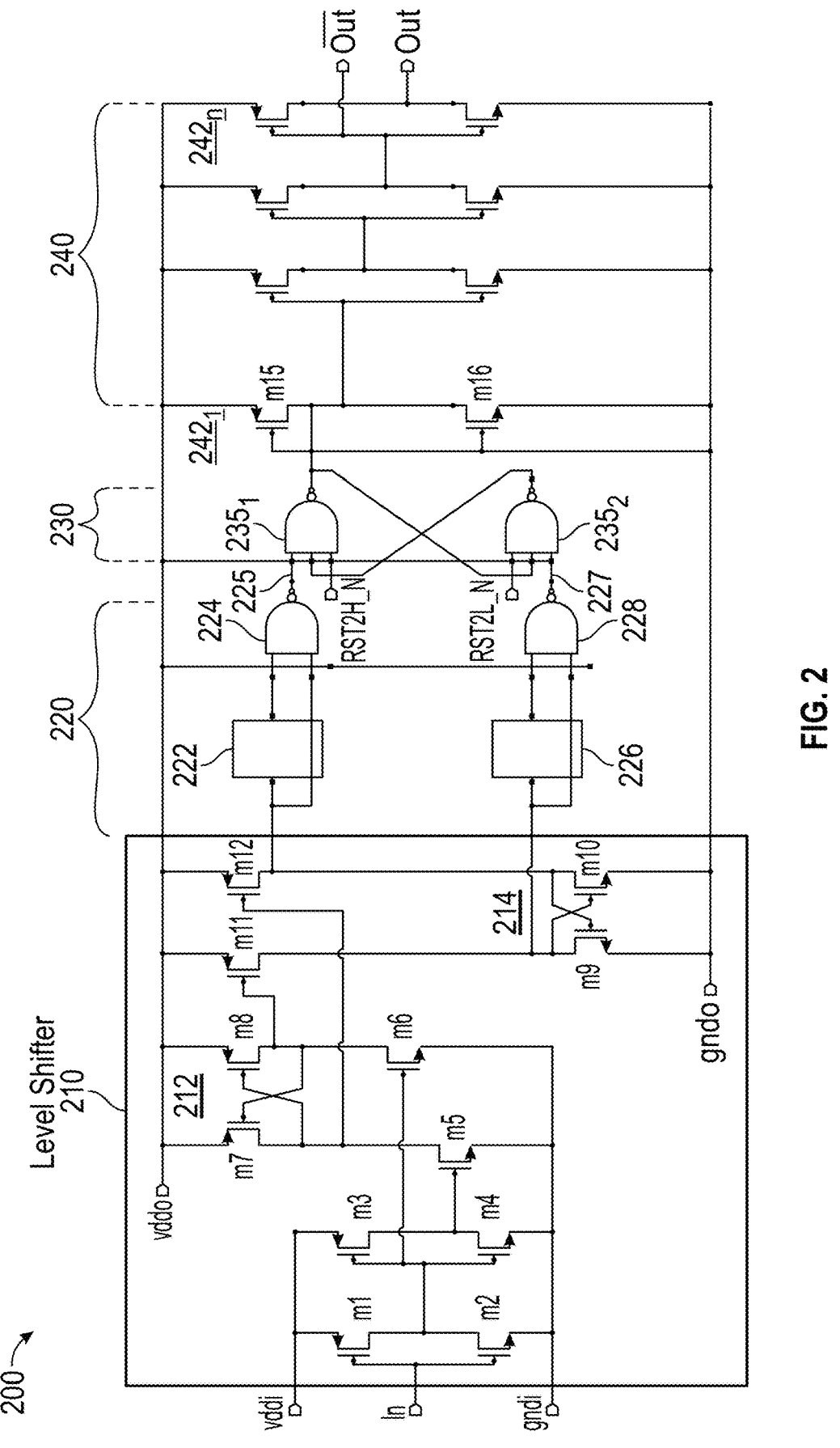
FIG. 2 is a schematic diagram of a level shifter in accordance with an embodiment.

Referring now to FIG. 2, shown is a schematic diagram of a level shifter in accordance with an embodiment. In FIG. 2, level shifter 200 is a more detailed implementation of a low distortion high speed level shifter. As shown, an incoming signal (In) is provided to a first stage level shifter 210. In general, level shifter 210 operates to shift the input signal from a first voltage level (e.g., a 0.8V supply voltage level provided by first voltage nodes (vddi and gndi) shown in FIG. 2), to a higher voltage level (e.g., the 1.2-1.8V supply voltage level provided by second voltage nodes (vddo and gndo) shown in FIG. 2). Note that these different supply voltages may be received from different on-chip voltage regulators (not shown for ease of illustration in FIG. 2). Thus level shifter 210 has two voltage domains.

As shown, the input signal is provided to a first inverter formed of metal oxide semiconductor field effect transistors (MOSFETs). More specifically, the input signal drives gate terminals of a P-channel MOSFET (PMOS) device M1 and an N-channel MOSFET (NMOS) device M2. In turn, the drain terminals of devices M1, M2 are coupled to drive gate terminals of another inverter formed of a pair of devices, namely a PMOS device M3 and an NMOS device M4. Note that as devices M1-M4 are in a first voltage domain (that is at a supply voltage level of 0.8V) of a level shifter, they may be of a first device size. This first device size is smaller than device sizes of MOSFETs present in a second voltage domain of the level shifter, as discussed below.

As further shown in FIG. 2, the drain terminals of devices M3, M4 drive a gate terminal of an NMOS device M5. Similarly, the inverted input signal (from the drain terminals of devices M1, M2) provided to the gate terminals of devices M3, M4 also drives a gate terminal of another NMOS device M6.

Still referring to FIG. 2, the drain terminals of NMOS devices M5, M6 couple to a first cross-coupled PMOS pair 212 formed of a pair of PMOS devices M7 and M8. These cross-coupled pull-up devices provide a first pull-up output signal at a drain terminal of PMOS device M8 that, in turn, drives a gate terminal of another PMOS device M11. In addition, the cross-coupled pull-up devices provide a second pull-up output signal at a drain terminal of PMOS device M7 that drives a gate terminal of another PMOS device M12. Thus as shown, first cross-coupled PMOS pair 212 provides these pull-up output signals as gate control signals to PMOS devices M11 and M12.

Still referring to FIG. 2, a second cross-coupled NMOS pair 214 is formed of a pair of NMOS devices M9 and M10. Via NMOS device M10 a first signal is output from first stage level shifter 210 to a first input of a pulse generator 220. In an embodiment, this first signal has a first edge having a faster slew rate than the second edge. Second edge has faster slew rate than first edge Note that PMOS device M12 is controlled by a gate signal (the second pull-up output signal) when active to control a voltage of this first signal.

With further reference to FIG. 2, via NMOS device M9 a second signal is output from first stage level shifter 210 to another input of pulse generator 220. Note that PMOS device M11 is controlled by a gate signal (the first pull-up output signal) when active to control a voltage of this second signal. This second signal has a first edge having a slower slew rate than the second edge.

Pulse generator 220 may include delay circuitry to delay and modify the level-shifted input signal to have shorter pulses. In the high level view shown in FIG. 2, pulse generator 220 may be implemented with a pair of paths. As seen, these paths each include inverter circuitry and logic circuitry. More specifically, a first path includes an inverter chain circuit 222 and a NAND gate 224, and a second path includes an inverter chain circuit 226 and a NAND gate 228. Understand that the inverter chain circuits may be formed with one or more pairs of CMOS devices (e.g., with each pair having a PMOS device stacked on an NMOS device).

By providing this pulse generation circuitry, short pulses (e.g., having a duty cycle between 5 and 10%, and in an example implementation on the order of between approximately 0.25 and 0.5 nanoseconds) may be generated. Note also that the pulse width of these pulses may be controlled to be greater than a threshold duration (which may be 2× of a gate delay, such as the NAND gates described below).

With reference to the top path of pulse generator 220, NAND gate 224 receives the input and output of inverter chain circuit 222 (a level-shifted signal and a phase-delayed level-shifted signal) and outputs a resulting pulse signal as a first pulse signal 225, which is provided to a first input of SR latch 230. SR latch 230 is formed of cross-coupled NAND gates $235_{1,2}$. More specifically as shown, first pulse signal 225 from pulse generator 220 is provided to a first input of NAND gate $235_1$. A second input to NAND gate $235_1$ is a reset input signal (RST2H_N). In an embodiment, this signal may be provided from higher level system control, and is a primary enable, which also sets SR latch 230 to the correct initial condition. Finally, as shown in FIG. 2, a third input to NAND gate $235_1$ is received from the output of corresponding NAND gate $235_2$.

With reference to the bottom path of pulse generator 220, NAND gate 228 receives the input and output of inverter chain circuit 226 (a level-shifted signal and a phase-delayed level-shifted signal) and outputs a resulting pulse signal as a second pulse signal 227, which is provided to a second input of SR latch 230, namely to a first input of NAND gate $235_2$. A second input to NAND gate $235_2$ is a reset input signal (RST2L_N) (which also may be received from higher level system control). Finally, as shown in FIG. 2, a third input to NAND gate $235_2$ is received from the output of corresponding NAND gate $235_1$.

As further shown in FIG. 2, the output of SR latch 230 is provided to a duty cycle shaper 240. In the embodiment of FIG. 2, duty cycle shaper 240 is implemented with a plurality of inverters $242_{1-n}$. As shown, each inverter 242 includes a PMOS device M15 and an NMOS device M16 (one representative pair is enumerated in FIG. 2). At a final output of shaper 240, a level shifted output signal (Out) is provided. Although FIG. 2 illustrates presence of this duty cycle shaper, in other implementations, this shaper may be optional. As shown in FIG. 2, a complementary output signal also may be provided, optionally. With embodiments herein, this level-shifted output may have low distortion, high data rate capabilities. Although shown at this high level in the embodiment of FIG. 2, understand that many variations and alternatives are possible.

Figure 3:
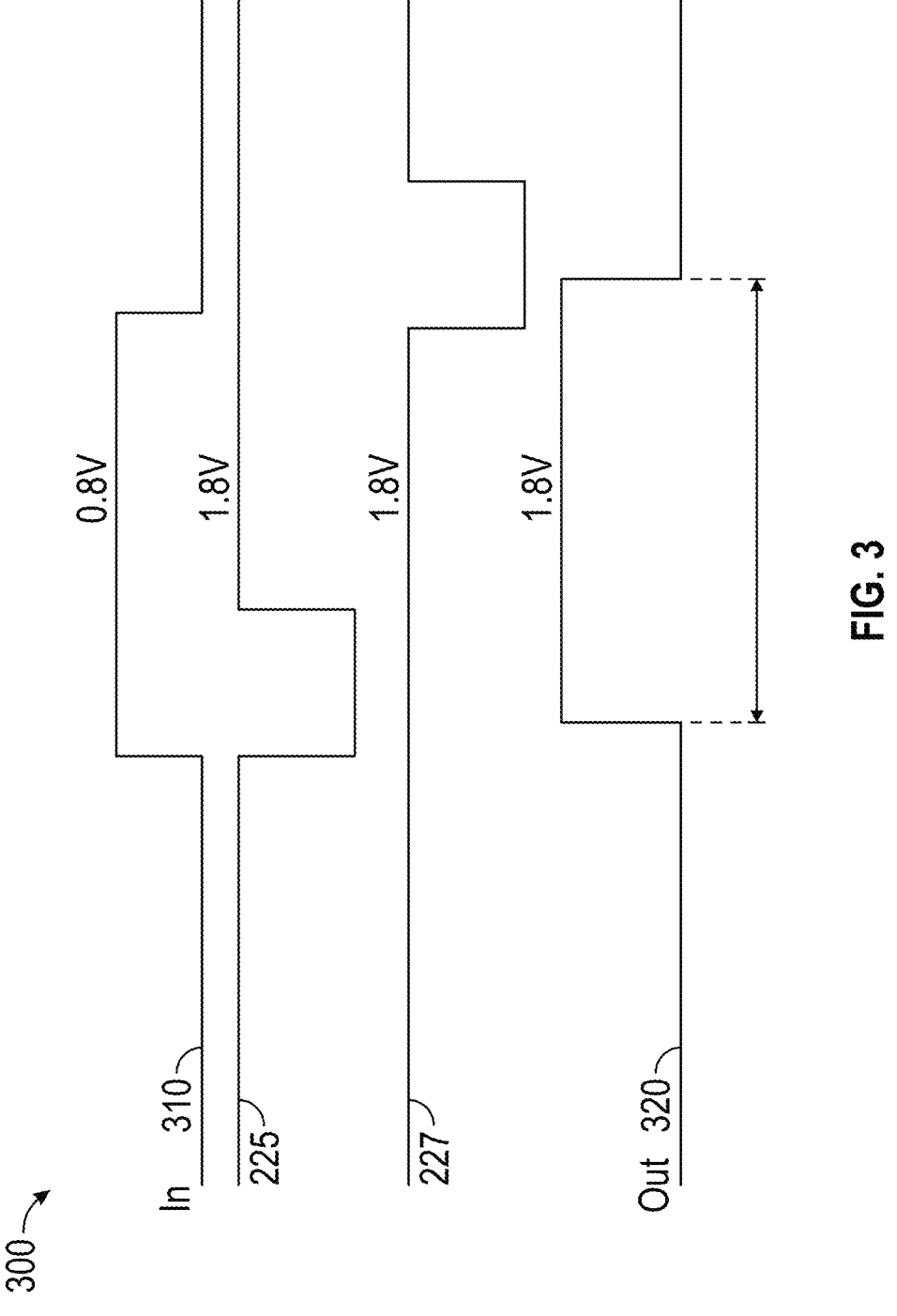
FIG. 3 is a timing diagram illustrating operation according to an example implementation.

Referring now to FIG. 3, shown is a graphical illustration of operation of a level shifter in accordance with an embodiment. As illustrated in FIG. 3, an input signal 310 is received at a first voltage level. By operation of the level shifter, an output signal 320 is generated. As shown, output signal 320 is output at a second voltage level, higher than the first voltage level. In other aspects, output signal 310 has the same characteristics, including same pulse width, etc. In addition, output signal 310 may be generated with low distortion using a level shifter in accordance with an embodiment. Such low distortion may be realized, at least in part by providing short pulses to an SR latch of the level shifter.

Thus as further illustrated in FIG. 3, note the presence of short pulses 225 and 227, which represent the output signals of pulse generator 220 described above with regard to FIG. 2. Note that the pulse widths of pulses 225, 227 may have a pulse width greater than twice the duration of a gate delay of 0.1 ns. By providing short pulses that are based on input edges of an input signal, low distortion is realized. This is so, even in the case of noisy supply or ground voltages that are provided to the level shifting circuitry. Still further with embodiments, devices used for forming cross-coupled pull-up and pull-down devices may be implemented with weaker (smaller) devices, thus reducing size and power consumption while providing for low distortion behavior.

Referring now to FIG. 4, shown is a flow diagram of a method in accordance with an embodiment. As shown in FIG. 4, method 400 is a method for operating a low distortion level shifter in accordance with an embodiment. As shown, method 400 begins by receiving an input signal having a first voltage level (block 410). This input signal may be received from a first voltage domain which may be at a relatively low voltage level, e.g., a 0.8V level. For purposes of discussion, assume that this input signal is a clock signal or a data signal to be communicated along a bus that operates at a higher voltage level.

Still referring to FIG. 4, next at block 420, this input signal is level shifted to at least one level-shifted signal having a second voltage level. In an embodiment, a first stage level shifter may perform this level shifting operation to generate this at least one level-shifted signal at the second higher voltage level. In an embodiment, this second voltage level may be at a voltage level of a second voltage domain. As examples, this second voltage domain may be between approximately 1.2-1.8V.

Still referring to FIG. 4, next at block 430, first and second pulses may be generated based on this at least one level-shifted signal. These pulses may be generated in pulse generation circuitry which may include delay circuitry such as may be implemented with inverter chains, along with logic circuitry, e.g., NAND gates, which receive the delayed versions of the at least one level-shifted signal and generate the pulses therefrom. Next at block 440, a latched output may be generated. This latched output may be based on these first and second pulses. In an embodiment, a latch circuit such as an SR latch may be used to generate this latched output.

At block 450, the latched output may be shaped, e.g., in duty cycle shaping circuitry, such as described above. Finally, at block 460, an output signal is output based on this shaped latched output. In embodiments, this output signal may be of at least the substantially similar width and shape as the input signal, and at a higher voltage level. This higher voltage level signal may be provided to the second voltage domain where it may be communicated, e.g., along a bus such as for communication to a memory, processing circuitry or so forth. Of course while described as clock or data signaling in this example, understand that a low distortion level shifter also may be used in connection with interface circuitry between voltage domains that operate at higher frequencies, e.g., intermediate frequency and/or RF frequencies.

Figure 5:
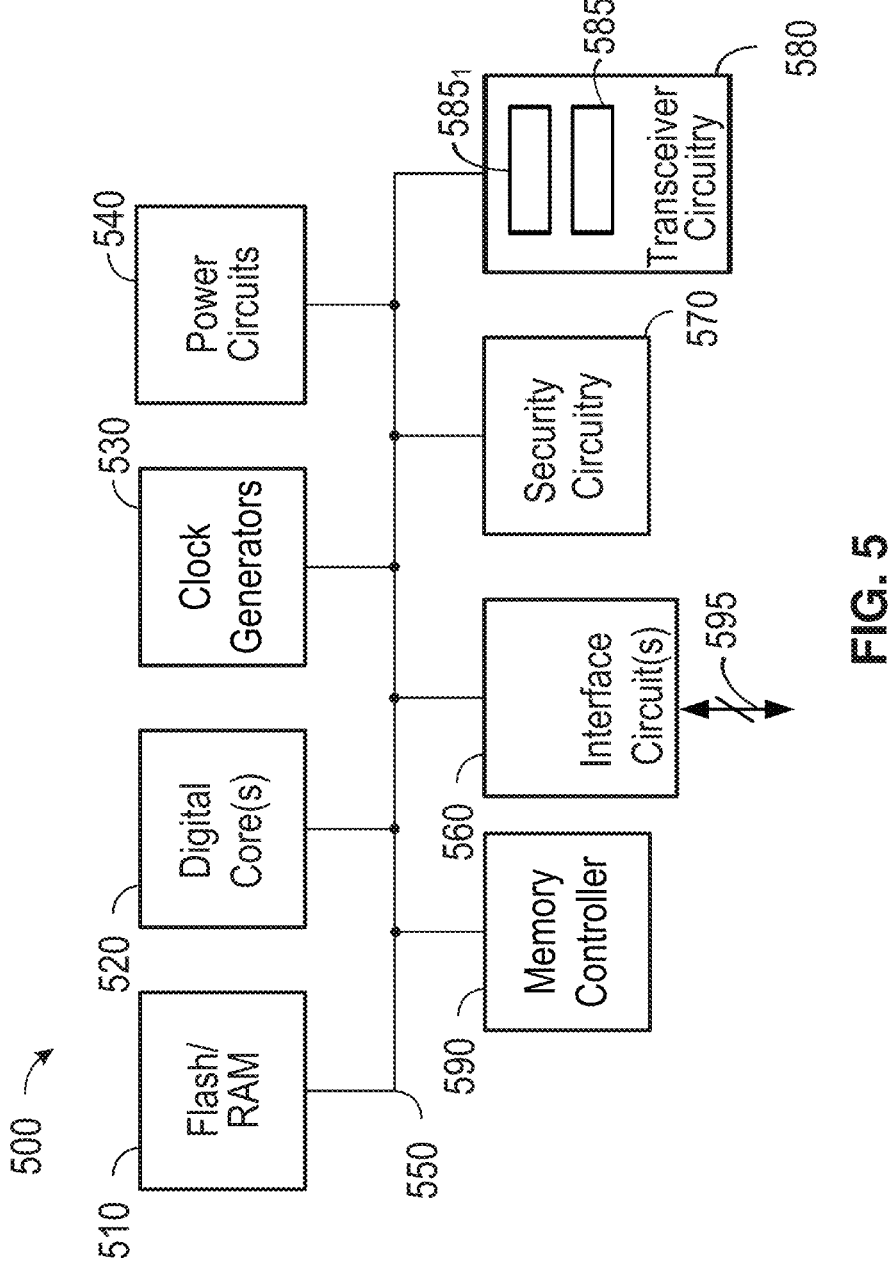
FIG. 5 is a block diagram of a representative integrated circuit that may include one or more level shifters in accordance with an embodiment.

Referring now to FIG. 5, shown is a block diagram of a representative integrated circuit 500 that may include one or more level shifters as described herein. In the embodiment shown in FIG. 5, integrated circuit 500 may be, e.g., a dual mode wireless transceiver that may operate according to one or more wireless protocols (e.g., WLAN and Bluetooth, among others) or other device that can be used in a variety of use cases. In one or more embodiments, the circuitry of integrated circuit 500 shown in FIG. 5 may be implemented on a single semiconductor die.

Integrated circuit 500 may be included in a range of devices including a variety of stations, including smartphones, wearables, smart home devices, IoT devices, vehicle devices, other consumer devices, or industrial, scientific, and medical (ISM) devices, among others.

In the embodiment shown, integrated circuit 500 includes a memory system 510 which in an embodiment may include volatile storage, such as RAM and non-volatile memory such as a flash memory. The flash memory is a non-transitory storage medium that can store instructions and data. In one or more embodiments, internal circuitry of memory system 510 may include one or more low distortion level shifters as described herein. As further shown integrated circuit 500 also may include a memory controller 590.

Memory system 510 couples via a bus 550 to one or more digital cores 520, which may include one or more cores and/or microcontrollers that act as processing units of the integrated circuit. In turn, digital cores 520 may couple to clock generators 530 which may provide one or more phase locked loops or other clock generator circuitry to generate various clocks for use by circuitry of the IC.

As further illustrated, IC 500 further includes power circuitry 540. Additional circuitry may be present depending on particular implementation to provide various functionality and interaction with external devices. Such circuitry may include interface circuitry 560 which provides a digital communication interface with additional circuitry (such as a memory, to couple to IC 500 via a link 595). In embodiments, interface circuitry 560 may include one or more level shifters as described herein to shift signals to a higher voltage with low distortion. IC 500 also may include security circuitry 570 to perform wireless security techniques.

In addition, as shown in FIG. 5, transceiver circuitry 580 may be provided to enable transmission and reception of wireless signals, e.g., according to one or more of a local area or wide area wireless communication scheme, such as Zigbee, Bluetooth, IEEE 802.11, IEEE 802.15.4, cellular communication or so forth. As shown, transceiver circuitry 580 includes multiple transceiver circuits $585_{1-n}$, to communicate according to multiple wireless communication protocols. Understand while shown with this high level view, many variations and alternatives are possible.

Figure 6:
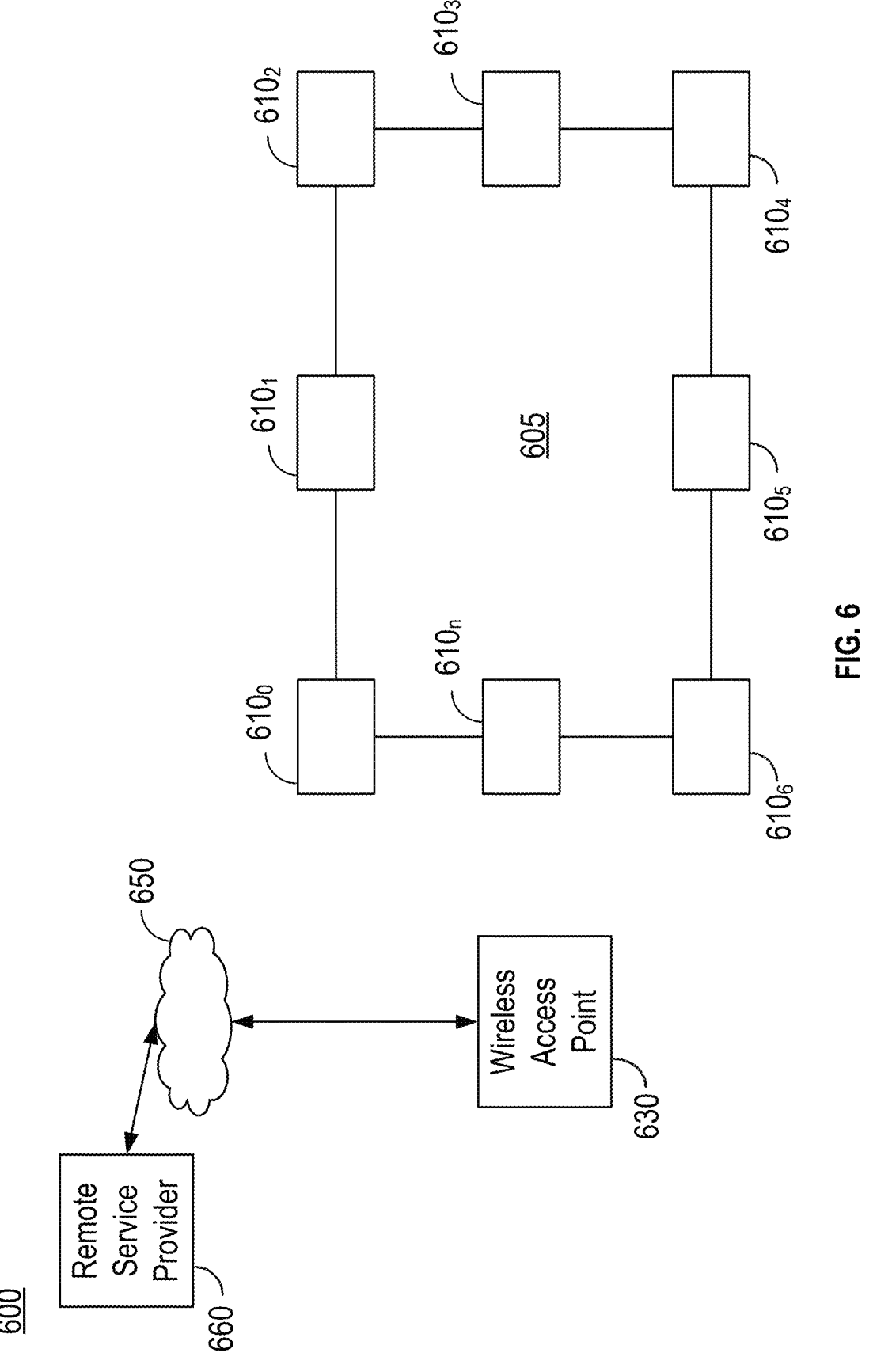
FIG. 6 is a high level diagram of a network in accordance with an embodiment.

ICs such as described herein including low distortion level shifting circuitry may be implemented in a variety of different devices such as wireless stations, IoT devices, vehicle devices or so forth. Referring now to FIG. 6, shown is a high level diagram of a network in accordance with an embodiment. As shown in FIG. 6, a network 600 includes a variety of devices, including wireless stations including smart devices such as IoT devices, access points and remote service providers.

In the embodiment of FIG. 6, a wireless network 605 is present, e.g., in a building having multiple wireless devices $610_{0-n}$. As shown, wireless devices 610 couple to an access point 630 that in turn communicates with a remote service provider 660 via a wide area network 650, e.g., the internet. Understand while shown at this high level in the embodiment of FIG. 6, many variations and alternatives are possible.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
   a level shifter to receive an input signal having a first voltage range and output at least one level-shifted signal based on the input signal, the level shifter comprising:
   a first cross-coupled device pair to receive the input signal and an inverted input signal and to output a first gate control signal and a second gate control signal;
   a first device coupled to the first cross-coupled device pair having a gate terminal driven by the first gate control signal;
   a second device coupled to the first cross-coupled device pair having a gate terminal driven by the second gate control signal; and
   a second cross-coupled device pair coupled to the first device and the second device, wherein the second cross-coupled device pair is to provide, to a pulse generation circuit, the at least one level-shifted signal comprising a first level-shifted signal and a second level-shifted signal, the second cross-coupled device pair comprising a pull-down circuit to define a first edge and a second edge of the at least one level-shifted signal;

the pulse generation circuit coupled to the level shifter, the pulse generation circuit to generate a first pulse and a second pulse based at least in part on the at least one level-shifted signal;

a latch circuit coupled to the pulse generation circuit, the latch circuit to receive the first pulse and the second pulse, and, based at least in part thereon, output a latched output signal; and a shaper circuit to receive the latched output signal and shape a duty cycle of the latched output signal to output an output signal based on the latched output signal, the output signal having a second voltage range greater than the first voltage range.

2. The apparatus of claim 1, wherein the pulse generation circuit comprises delay circuitry to delay the at least one level-shifted signal.

3. The apparatus of claim 2, wherein the delay circuitry comprises:

a first inverter chain circuit to receive the first level-shifted signal and output a first delayed signal; and a second inverter chain circuit to receive the second level-shifted signal and output a second delayed signal.

4. The apparatus of claim 3, wherein the delay circuitry further comprises:

a first logic circuit coupled to the first inverter chain circuit, the first logic circuit to receive the first level-shifted signal and the first delayed signal and based thereon, output the first pulse; and a second logic circuit coupled to the second inverter chain circuit, the second logic circuit to receive the second level-shifted signal and the second delayed signal and output based thereon the second pulse.

5. The apparatus of claim 4, wherein the first pulse and the second pulse have a pulse width greater than a gate delay of the latch circuit.

6. The apparatus of claim 1, wherein the latch circuit comprises a set reset (SR) latch to receive the first pulse and the second pulse and output the latched output signal.

7. The apparatus of claim 6, wherein the shaper circuit comprises a plurality of inverters to receive the latched output signal and output the output signal based thereon.

8. The apparatus of claim 1, further comprising:

a digital domain comprising at least one circuit to generate the input signal, the digital domain to operate at the first voltage range; and an input/output circuit coupled to the shaper circuit to communicate the output signal via a bus, the input/output circuit to operate at the second voltage range.

9. The apparatus of claim 1, wherein the apparatus comprises a low distortion level shifter.

10. An apparatus comprising:

a level shifter to receive an input signal having a first voltage range and output at least one level-shifted signal based on the input signal, the level shifter comprising:

a first cross-coupled device pair to receive the input signal and an inverted input signal and to output a first gate control signal and a second gate control signal;

a first device coupled to the first cross-coupled device pair having a gate terminal driven by the first gate control signal;

a second device coupled to the first cross-coupled device pair having a gate terminal driven by the second gate control signal; and a second cross-coupled device pair coupled to the first device and the second device, wherein the second cross-coupled device pair is to provide, to a pulse generation circuit, the at least one level-shifted signal comprising a first level-shifted signal and a second level-shifted signal;

the pulse generation circuit coupled to the level shifter, the pulse generation circuit to generate a first pulse and a second pulse based at least in part on the at least one level-shifted signal;

a latch circuit coupled to the pulse generation circuit, the latch circuit to receive the first pulse and the second pulse, and, based at least in part thereon, output a latched output signal, the latch circuit comprising:

a first logic circuit to receive the first pulse, a second latched output signal portion, and a first reset input signal, and output based thereon a first latched output signal; and a second logic circuit to receive the second pulse, the first latched output signal and a second reset input signal, and output based thereon the second latched output signal; and a shaper circuit to receive the latched output signal and output an output signal based on the latched output signal, the output signal having a second voltage range greater than the first voltage range.

11. The apparatus of claim 10, wherein the second cross-coupled device pair comprises a pull-down circuit to define a first edge and a second edge of the output signal.

12. The apparatus of claim 10, wherein the shaper circuit is to shape a duty cycle of the latched output signal.

13. The apparatus of claim 10, wherein the first reset input signal is to set the latch circuit to an initial condition.

* * * * *